US006538368B1

(12) United States Patent
Fox et al.

(10) Patent No.: US 6,538,368 B1
(45) Date of Patent: Mar. 25, 2003

(54) ELECTRON-EMITTING DEVICES

(75) Inventors: Neil Anthony Fox, Cheltenham (GB); Wang Nang Wang, Martletts, Lympley Stoke, near Bath, Wiltshire BS8 1TL (GB)

(73) Assignees: Smiths Group PLC, London (GB); part interest; Wang Nang Wang, Wiltshire (GB); part interest ( * ) Notice: Subject to any disclaimer, the term of this patent is extended or adjusted under 35 U.S.C. 154(b) by 0 days.

(21) Appl. No.: 09/513,113

(22) Filed: Feb. 25, 2000

(30) Foreign Application Priority Data

Mar. 6, 1999 (GB) ............................................ 9905132

(51) Int. Cl.[7] .............................. H01J 1/05; H01J 1/62; H01L 29/161

(52) U.S. Cl. .......................... 313/311; 313/310; 257/10

(58) Field of Search ................................ 313/311, 309, 313/310, 495, 496; 257/10, 341

(56) References Cited

U.S. PATENT DOCUMENTS

| | | | | |
|---|---|---|---|---|
| 4,149,308 A | | 4/1979 | Smith | 29/583 |
| 4,259,678 A | * | 3/1981 | Van Gorkom et al. | 257/10 |
| 4,683,399 A | * | 7/1987 | Soclof | 313/495 |
| 5,202,571 A | * | 4/1993 | Hirabayashi et al. | 257/10 |
| 5,712,502 A | * | 1/1998 | Mitlehner et al. | 257/341 |
| 5,945,777 A | * | 8/1999 | Janning et al. | 313/310 |
| 6,084,340 A | * | 7/2000 | Bachmann et al. | 313/311 |

FOREIGN PATENT DOCUMENTS

| | | | |
|---|---|---|---|
| EP | 0 706 196 A2 | 4/1996 | |
| EP | 0 718 864 A1 | 6/1996 | |
| EP | 0 706 196 A3 | 8/1996 | |
| EP | 0 725 415 A2 | 8/1996 | |
| EP | 0725415 A2 * | 8/1996 | H01J/9/02 |
| EP | 0 789 383 A1 | 8/1997 | |
| EP | 0 924 737 A1 | 6/1999 | |

* cited by examiner

*Primary Examiner*—Sandra O'Shea
*Assistant Examiner*—Bao Truong
(74) *Attorney, Agent, or Firm*—Connolly Bove Lodge & Hutz, LLP; Larry J. Hume

(57) ABSTRACT

An electron emitter, such as for a display, has a substrate and regions of n-type material and p-type material on the substrate arranged such that there is an interface junction between the regions exposed directly to vacuum for the liberation of electrons. The p-type region may be a thin layer on top of the n-type region or the two regions may be layers on adjacent parts of the substrate with adjacent edges forming the interface junction. Alternatively, there many be multiple interface junctions formed by p-type particles or by both p-type and n-type particles. The particles may be deposited on the substrate by an ink-jet printing technique. The p-type material is preferably diamond, which may be activated to exhibit negative electron affinity.

20 Claims, 7 Drawing Sheets

ELECTRON-EMITTING DEVICES

BACKGROUND OF THE INVENTION

This invention relates to electron-emitting devices.

Electron-emitting devices are used in various applications such as in light-emitting devices or displays, high-frequency vacuum electronics or in applications where an electron source is needed for gas ionisation. Conventional electron-emitter devices are of a planar construction having a layers of p-type and n-type material overlying one another. When a voltage is applied across the layers, electrons are produced at the junction between the different materials. The electrons are caused to tunnel through the upper layer to its upper surface, which is exposed to vacuum where the electrons are liberated. Examples of such electron emitters are described in U.S. Pat. No. 5,202,571, GB 2322001 and GB 2322000.

BRIEF SUMMARY OF THE INVENTION

It is an object of the present invention to provide an alternative electron emitter.

According to one aspect of the present invention there is provided an electron emitter comprising a region of n-type material, a region of p-type material and an interface junction between the two regions, the interface junction being exposed to vacuum for liberation of electrons directly from the junction into the vacuum.

The regions of n-type material and p-type material may be formed by a layer of one material on the other material, the interface junction being exposed at an edge of one of the layers. The p-type material is preferable formed on the layer of n-type material, an upper surface of the layer of p-type material being exposed to the vacuum and the layer of p-type material being thin enough to allow electron transmission through the layer into the vacuum in addition to liberation at the exposed junction. Alternatively, the regions of n-type material and p-type material may be provided by respective layers on a common substrate, the interface junction being formed along adjacent edges of the two regions. The edges of the layers may be inclined relative to the substrate. The region of p-type material is preferably less than approximately 1 micron thick.

The emitter may include a plurality of exposed interface junctions. The plurality of interface junctions are preferably formed by a plurality of particles of one type of material adjacent regions of the other type of material. The particles may be of p-type material and may be of both p-type material and of n-type material, the junctions being formed between particles of different types. The particles are preferably in the size range of 500 nm to 50 nm. The n-type region may be a layer on a substrate, the particles being of p-type and being located on the substrate between an edge of the n-type region and an ohmic contact.

The p-type material is preferably activated to exhibit negative electron affinity such as by treatment with a hydrogen plasma or by deposition of a low work function material. The p-type material is preferably of diamond.

According to another aspect of the present invention there is provided a method of forming an electron emitter device including the steps of providing a suspension of p-type particles in a suitable solution and using an ink-jet printing process to deposit the particles on a substrate and thereby form a plurality of electron emitter junctions.

According to a further aspect of the present invention there is provided a method of forming an electron emitter device including the steps of providing a suspension of n-type particles in a suitable solution and using an ink-jet printing process to deposit the particles on a substrate and thereby form a plurality of electron emitter junctions.

Both n-type and p-type particles may be deposited on the substrate so that junctions are formed between n-type particles and p-type particles. The p-type particles are preferably of diamond.

According to a fourth aspect of the present invention there is provided an electron emitter formed by a method according to the above other or further aspect of the present invention.

According to a fifth aspect of the present invention there is provided a display including an electron emitter according to the above one or fourth aspect of the present invention.

The display may include a plurality of electron emitters.

Electron emitter devices and a display according to the present invention, will now be described, by way of example, with reference to the accompanying drawings.

DETAILED DESCRIPTION OF PREFERRED EMBODIMENTS

Figure 1:
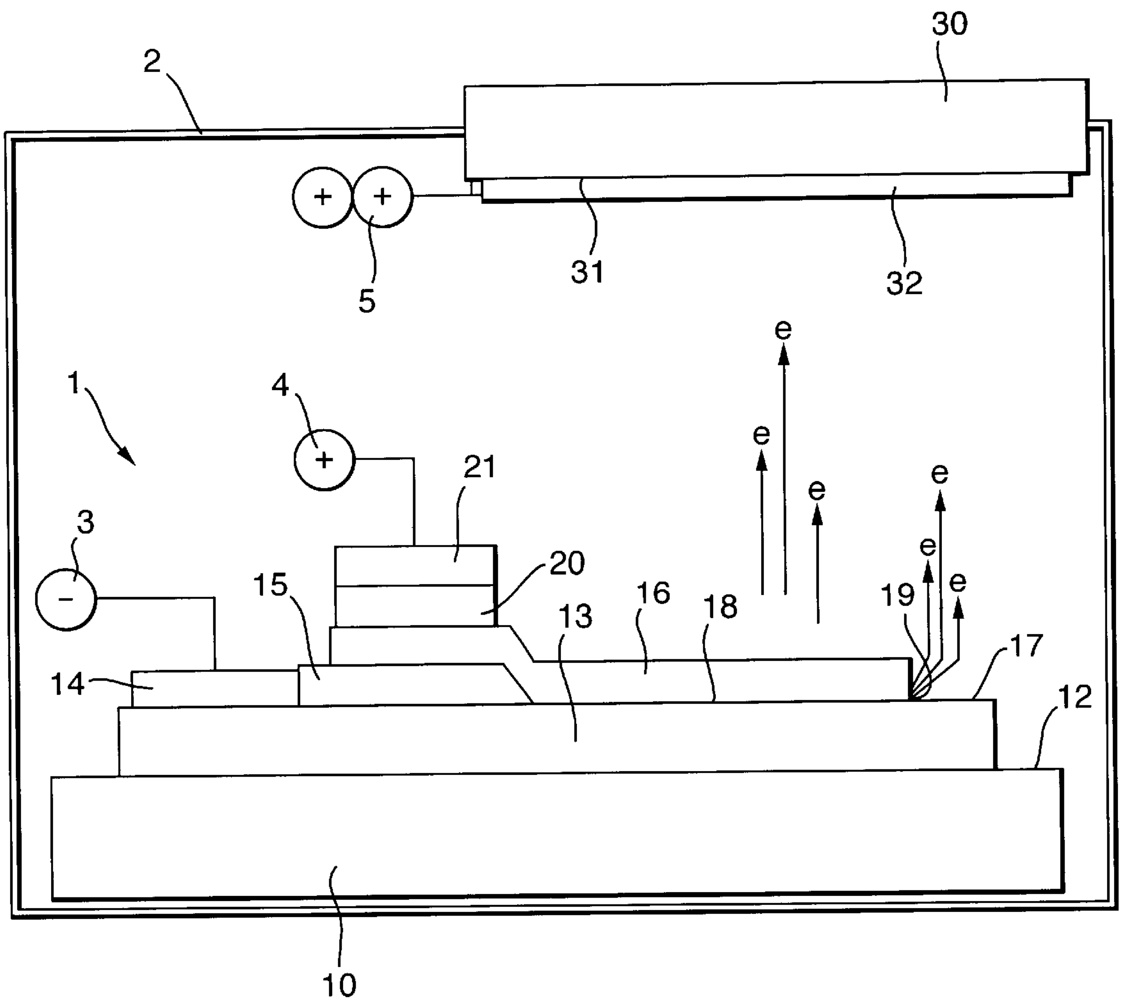
FIG. 1 is a schematic side elevation view of a first embodiment electron emitter device.

With reference first to FIG. 1, the electron emitter device 1 has an electrically-insulative glass plate substrate 10 (such as of fused quartz or 7059) supporting on its upper surface 12 a layer 13 of n-type silicon. Electrical contact to the silicon layer 13 is established by a silver electrode 14 on the upper surface of the silicon layer at its left-hand edge. Adjacent the electrode 14 on the upper surface of the silicon layer 13 is an insulating pad 15 of silica formed by oxidizing a part of the silicon layer. A layer 16 of p-type diamond extends over the insulating pad 15 and over the upper surface of the silicon layer 13, terminating a short distance before the right-hand end of the silicon layer, leaving a region 17 of the upper surface of the silicon layer exposed adjacent the diamond layer. The area where the lower surface of the diamond layer contacts the upper surface of the silicon layer provides an interface junction 18 between the two materials. This junction 18 is exposed along the right-hand edge of the diamond layer 16 to provide an exposed junction 19. Electrical contact to the diamond layer 16 is made where the layer extends over the insulating pad 15, by means of a contact pad 20 of titanium covered by a coating 21 of gold.

The electron emitter 1 is located beneath a cover glass 30 having a thin, transparent coating 31 on its underside of an electrically-conductive material, such as indium/tin oxide. On top of the conductive coating 31 is deposited a layer 32 of a phosphor material forming an anode screen.

The electron-emitter device 1 is enclosed within a housing 2 of which the cover glass 30 provides a part at least of one wall, the housing being evacuated to vacuum.

The contact 14 is connected to a source 3 of negative voltage, the contact 20, 21 is connected to a source 4 of positive voltage and the conductive coating 31 on the cover glass 30 is connected to a source 5 of positive voltage greater than that of the first positive source 4.

The silicon and diamond layers 13 and 16 form a heterojunction emitter for which electron emission occurs upon application of a forward voltage bias of less than 5 V. The primary path for the electron emission is from the silicon layer 13 into the large area junction interface 18 and directly through the thin p-diamond film 16 to its upper surface, which is exposed to vacuum. A secondary path for emission is directly from the junction interface 19 where it is exposed to vacuum. This secondary path from the exposed junction 19 significantly increases the flow of electrons compared with devices where electrons are only emitted through a layer of material. For both the primary and secondary emission paths, trap-aided recombination due to the large lattice mis-match (greater than 7%) between silicon and diamond at the junction interface is the dominant current mechanism rather minority carrier diffusion.

Electrons emitted through the layer 16 and from the exposed junction 19 travel to the anode screen 30 as a result of the anode voltage. Electrons striking the screen 30 cause the phosphor layer 32 to fluoresce and emit visible light, which passes outwardly through the cover glass.

In heavily doped n-type material having a high concentration of trap states above the Fermi level, pnn type Auger recombination occurs, which can promote hot electrons into the conduction band of the p-diamond. In the presence of a NEA (negative electron affinity) surface and under the influence of a low anode voltage ($<10V/\mu m$) these electrons will experience the effects of band-bending and field penetration respectively, allowing them to tunnel through the lowered vacuum barrier and be emitted towards the phosphor (anode) screen.

The p-diamond layer 16 is preferably less than 1 micron thick, it preferably has a hole carrier concentration above $10^{17}$ $cm^{-3}$ and exhibits a low concentration of grain boundaries and included graphitic material. The exposed upper surface of the p-diamond layer 16 may be activated to exhibit a NEA either by a hydrogen plasma treatment as detailed below or by the deposition of a low workfunction metal. For example, metals such as nickel or titanium, are known to induce NEA on a hydrogen-free (111) p-diamond surface; copper, caesium or cobalt are also believed to induce a NEA on (100) p-diamond surface.

The device may be fabricated by standard growth and lithographic masking techniques and involves the steps of patterning the glass substrate glass with a suitable n-contact metal by sputtering, the selective deposition of a polysilicon layer onto the metallization by pyrolysis of SiH4, the selective patterning of a silicon oxide layer over the metallization and polysilicon areas, by thermal oxidation or high pressure CVD using $O_2$ and $SiH_4$. The p-type, thin film diamond layer 16 is then patterned through an aligned mask by deposition using a known commercial gas synthesis method such as hot filament CVD, microwave CVD, DC plasma CVD, or RF plasma CVD . The raw material for carbon can be hydrocarbon gas such as methane, ethane, acetylene: organic liquid such as alcohol; or carbon dioxide gas, which may be suitably added with hydrogen. The impurity for obtaining the p-type layer 16 can be an element from group three of the periodic table. For example, boron doping can be achieved by the addition of a boron-containing compound to the raw material gases. Alternatively boron doping could be achieved by ion-implantation of an intrinsic diamond layer.

A series of post-growth surface treatments may be employed to improve the electrical properties of the p-diamond layer 16.

The hole concentration can be enhanced either by thermal annealing at a temperature in the range 500° C. to 750° C. (depending on substrate glass) in a helium, or nitrogen ambient or alternatively by excimer laser annealing in a high vacuum ambient. The aim of this treatment is to liberate the hydrogen included in the film, which blocks the diffusion of incorporated boron into substitutional lattice sites in diamond. After this surface treatment, the p-diamond layer is exposed to chemical cleaning agents to remove the thin non-diamond surface layer.

The conductivity across the thin diamond layer 16 can be enhanced by using a hydrogen plasma treatment to smooth and re-structure the polycrystalline diamond surface, reducing the density of grain boundaries. The treatment may be accomplished in a low pressure hydrogen ambient with the p-diamond layer biased to a positive dc voltage in excess of 300V. This treatment exposes the diamond surface to a high flux of atomic hydrogen and ions which causes a reduction in the surface roughness of the surface and a reduction in the density of grain boundaries due to the creation of quasi-continuous films. These effects are attributed to hydrogen-atom-assisted surface diffusion which can regenerate $sp^3$ (diamond) crystallinity while etching $sp^2$-bonded amorphous material.

A second consequence of exposing the p-diamond film to this hydrogen plasma treatment is to induce a NEA condition by providing a monohydride termination of the dangling bonds on the (111) 1×1 or (100) 2×1 diamond surface structure. An NEA surface can be used to enhance the electron emission properties from an electrode into vacuum.

Figure 2:
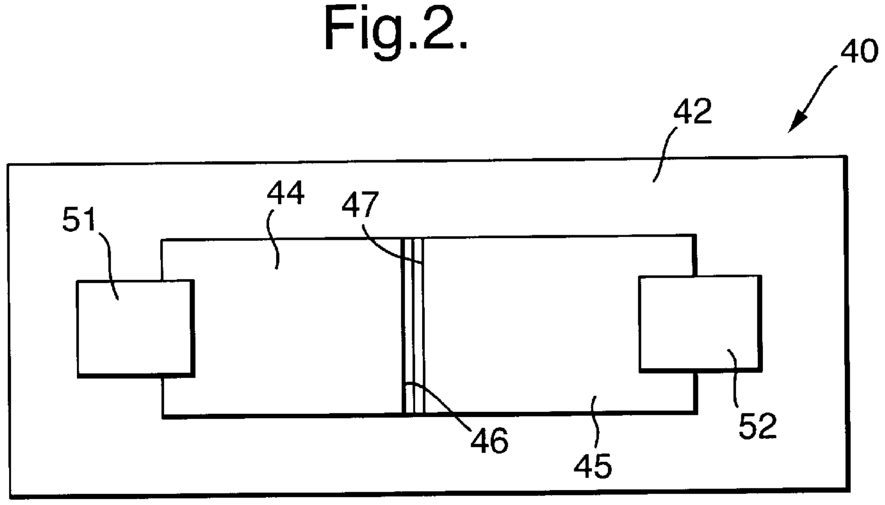
FIG. 2 is a plan view of a second embodiment electron emitter device.
Figure 3:
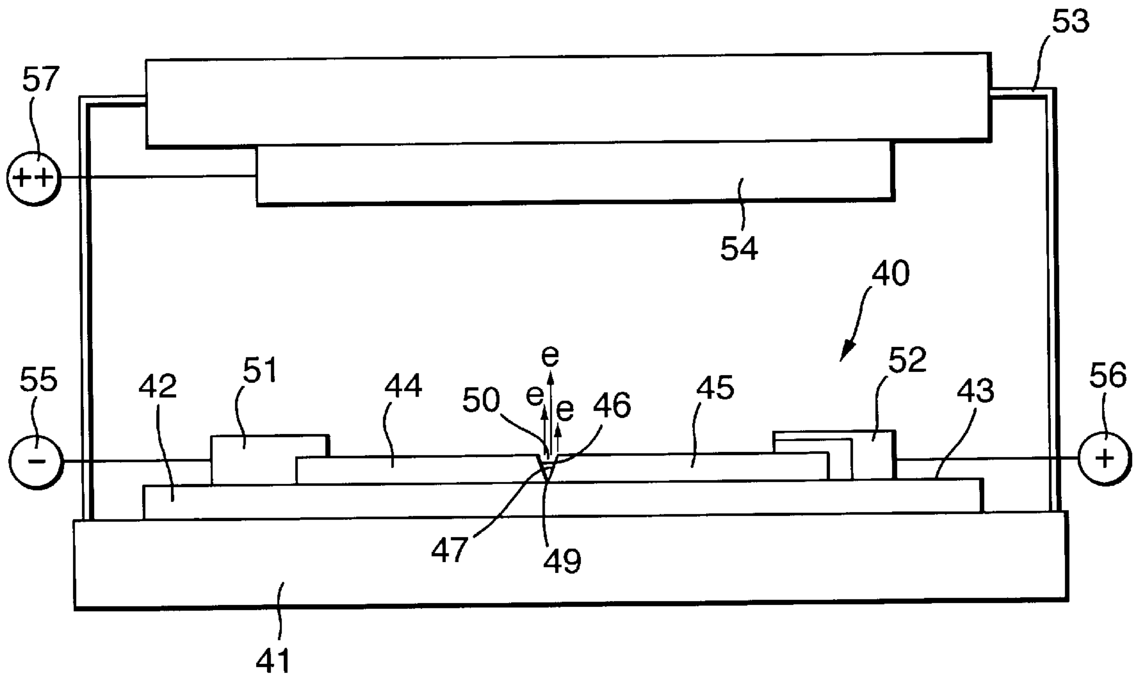
FIG. 3 is a side elevation view of the second embodiment shown in FIG. 2.

With reference now to FIGS. 2 and 3 there is shown an alternative electron emitter device 40 having a glass base 41 supporting a fused quartz substrate 42. The upper surface 43 of the quartz substrate 42 supports a layer 44 of polycrystalline n-type silicon and a layer 45 of polycrystalline p-type CVD diamond. The two layers 44 and 45 are of rectangular shape with their inner ends 46 and 47 facing one another. The end faces 46 and 47 are inclined at a shallow angle from the vertical with the lower part of the two end faces contacting one another to form a junction 49 and a V-shape gap 50 that is wider at the upper surface of the layers. A silver contact 51 is formed on the substrate 42 in contact with the silicon layer 44. A titanium/gold contact 52 is formed at the opposite end of the substrate 42 in contact with the diamond layer 45.

The electron emitter 40 is located in an evacuated housing 53 below a phosphor-coated anode screen 54, the silicon contact 51 being connected to a negative voltage source 55, the diamond contact 52 being connected to a positive voltage source 56, and the anode screen being connected to a source 57 of higher positive voltage.

Electron emission occurs at the junction 49 in response to a forward bias voltage of less than 10 V. The planar geometry of this emitter 40 localizes the junction interface 49 between the silicon and diamond layers 43 and 44, which has a limited contact area. The interface region 49 is bounded by the substrate 42 below and by a vacuum on its upper surface. The interface region 49 need not be continuous along its length but could contain a large proportion of voids bringing the substrate 42 into contact with the vacuum.

The p-diamond layer 45 is preferably less than 1 micron in thickness and exhibits a (100) textured surface having a very low density of grain boundaries and a high carrier density. At the junction interface region 49 the p-diamond layer 45 terminates in a crystal surface texture containing both (100) and (111) faceted crystals.

The p-diamond surface and interface region 49 may be subjected to the same surface treatment as described above in respect of the emitter shown in FIG. 1, to enhance p-type semiconductivity. The p-diamond surface may be activated to exhibit NEA. The localised nature of the interface 49 and the high degree of carrier confinement produced by the planar junction geometry cause the level of trap-aided recombination and Auger electron generation to be intensified. Substrate-assisted tunnelling via metallic impurities may also contribute carriers to the forward junction current on account of the presence of voids in the junction interface 49. This can lead to the creation of an additional source of carriers that are able to tunnel through the vacuum barrier at the p-diamond surfaces and contribute to the electron emission yield from the junction interface 49 towards the anode screen 54.

The emitter structure shown in FIGS. 2 and 3 may be fabricated using the same processing techniques as for the emitter shown in FIG. 1, the planar arrangement making it simpler to fabricate than the emitter shown in FIG. 1. Also, surface treatments employed during the fabrication of the emitter shown in FIG. 1 may also be used in the fabrication of the emitter shown in FIGS. 2 and 3.

Figure 4:
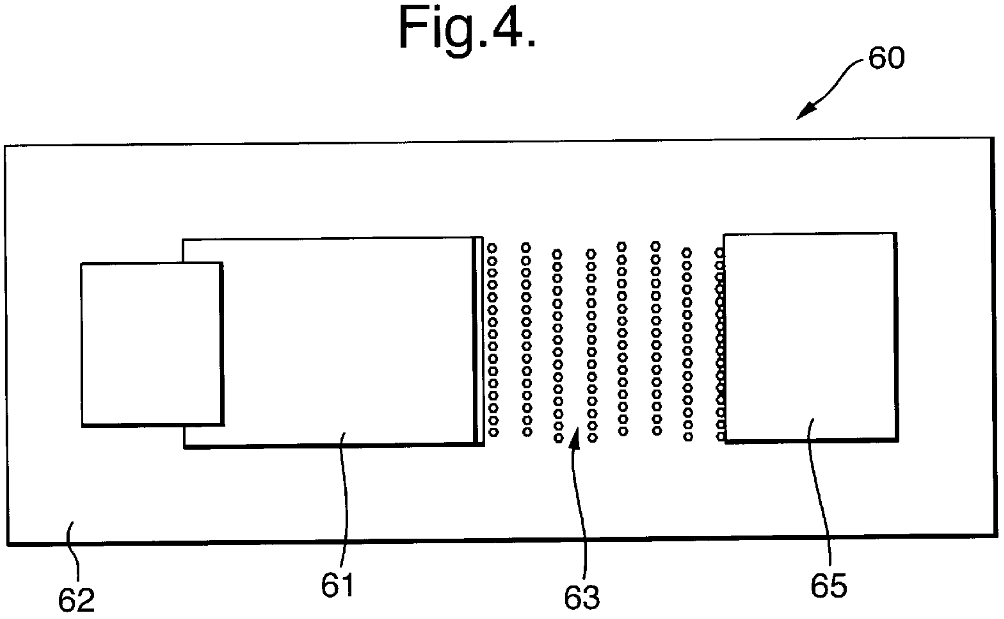
FIG. 4 is a plan view of a third embodiment electron emitter device.
Figure 5:
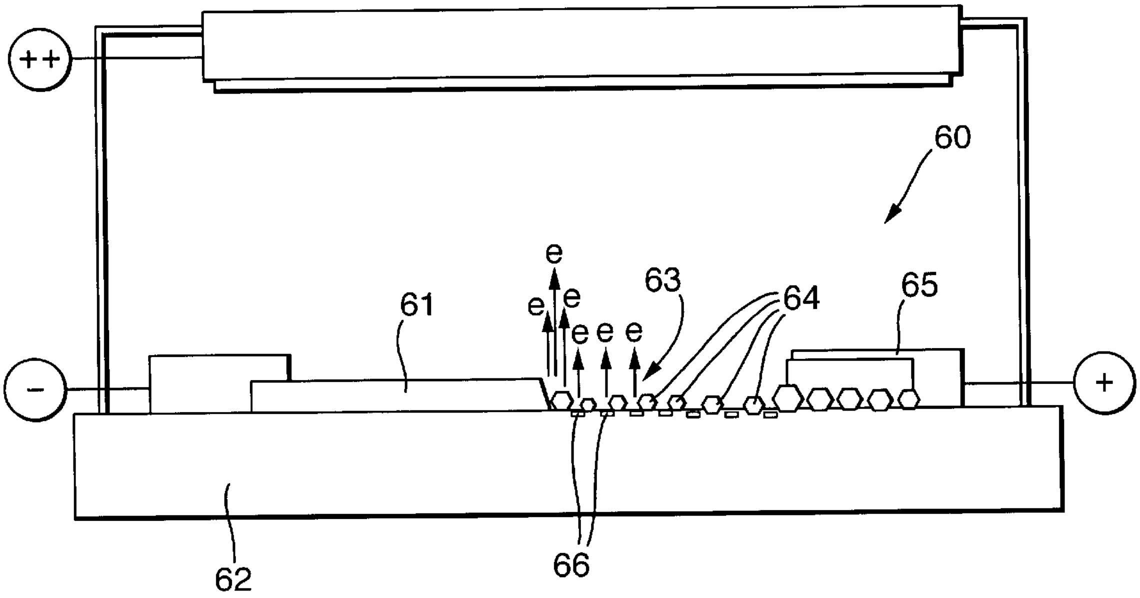
FIG. 5 is a side elevation view of the third embodiment shown in FIG. 4.

With reference now to FIGS. 4 and 5, there shown an emitter 60 similar to that shown in FIGS. 2 and 3 in that it has an n-type silicon layer 61 formed on an insulating substrate 62. The diamond layer, however, is discontinuous, being formed by a layer 63 of nano-crystalline, boron-doped, p-type diamond particles 64. Typically, the particles 64 have sizes ranging from 500 nm down to 50 nm. The layer 63 of diamond particles 64 makes ohmic contact with a contact 65. The resulting junction interface structure is composed of an array of isolated interfaces preferably formed between the poly-silicon layer 61 and the diamond nano-particles 64. Consequently the effective area of the junction directly linking the polysilicon 61 and the diamond particles 64 is small. This has the effect of limiting the number and density of interface trap states, leading to an increase in the rate of injection of minority carriers into the p-diamond particles 64 from the $n^+$-silicon 61.

The $n^+$-Si may be substituted with other suitably n- or $n^+$-doped semiconductors such as germanium, diamond, silicon carbide, boron nitride or aluminium nitride.

Conduction between the interface region and the p-diamond contact 65 is mediated by impurity levels arising from the presence of metal ions 66 on the surface of the insulating substrate 62 in the regions surrounding the diamond particles 64 and from the space-charge which is generated between the diamond particles at the junction interface and those slightly removed from it.

This distributed diamond particle structure enhances the incidence of substrate-assisted tunnelling/hopping of electrons through the region containing the p-diamond particles 64. This conduction mechanism occurs under the influence of the forward voltage bias in the range of 5 to 15 V applied across the junction. A small percentage (less than 1%) of this forward current will be lost from the smaller particle surfaces due to their high geometric field enhancement factors, which enable electrons to tunnel through the lowered vacuum barrier on the particle surfaces towards the anode screen. The emission yield may be enhanced significantly if the p-diamond particles 64 are treated to exhibit NEA, allowing thermalized carrier emission to occur from the conduction band minimum into the vacuum. The approach is to induce a NEA at the diamond/substrate interface by introducing metal atoms/ions, such as nickel, onto the substrate surface during the fabrication of the diamond junction emitter structure. Subsequent surface treatments involving exposure to atomic hydrogen followed by vacuum thermal annealing are employed to activate NEA on the p-diamond surfaces by causing metal atoms to be brought into electrical contact with them. The supply of thermalized carriers into the p-diamond conduction band is provided by the field-induced tunnelling of electrons via impurity and interface states formed at the junction between diamond particles 64 and the underlying substrate 62.

Both the mono-hydride and adsorbate-free diamond surface with mono-layer coverage of nickel have been reported to show NEA; ref. J. Van der Weide and R. J. Nemanich, Phys.Rev.B 49,13,629,(1994).

The heterojunction electron emitter shown in FIGS. 4 and 5 may be fabricated by a printing and processing method described in WO98/27568.

The diamond nanogrit can be deposited in the desired pattern either by selective deposition through photoresist masks or by silk screen printing. Alternatively, an ink-jet printing process could be used in which diamond nanogrit is suspended in an aqueous solution containing surfactants formulated to exhibit a viscosity suitable for the print head being used, typically in the region of 2.3 to 3 centipoise. This enables the nanogrit to be deposited with a carefully controlled particle distribution, with high precision, and in a reproducible manner in order to fabricate an array of emitter sites with similar electrical characteristics.

Figure 6:
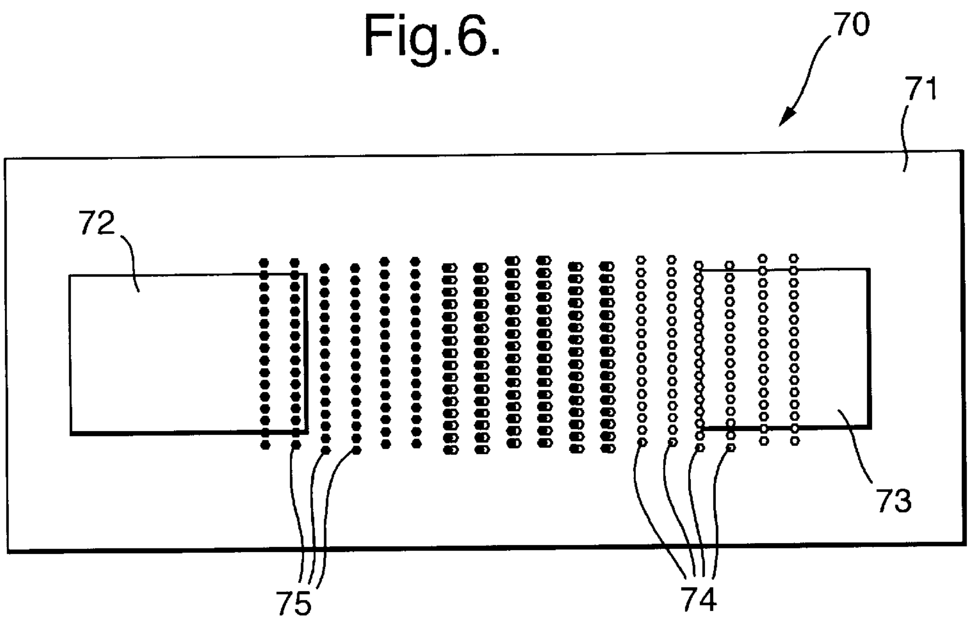
FIG. 6 is a plan view of a fourth embodiment electron emitter device.
Figure 7:
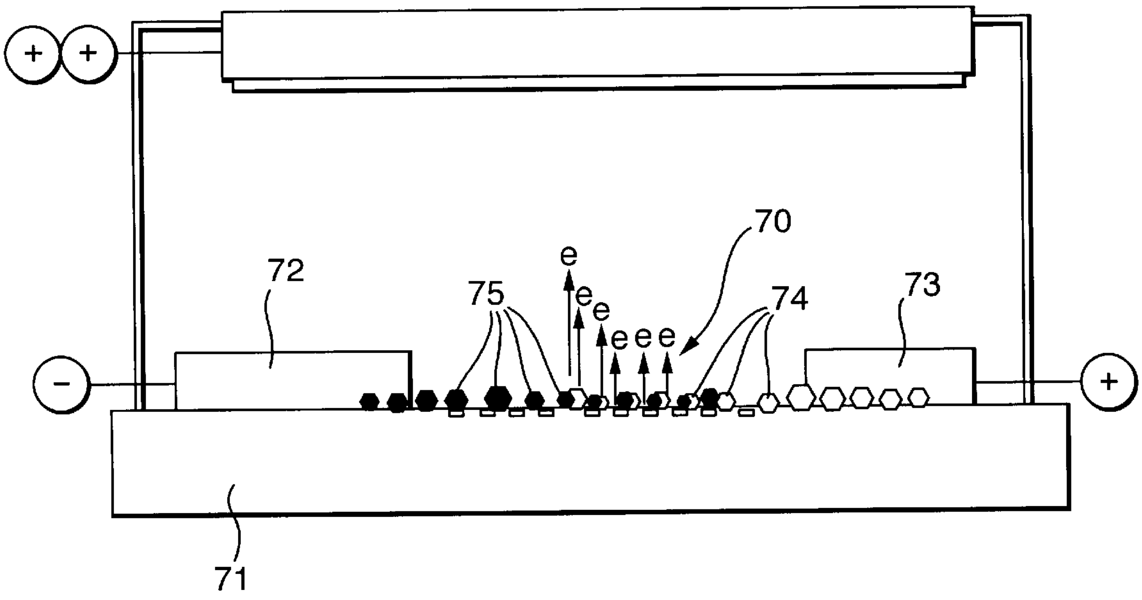
FIG. 7 is a side elevation view of the fourth embodiment electron emitter device.

With reference now to FIGS. 6 and 7, there is shown a further alternative electron emitter device 70 where electron emission is produced from junctions between p-type and n-type material exposed in a vacuum. This emitter device 70 has an insulative substrate glass 71 with two metal contacts 72 and 73 spaced from one another. Heterojunction emitters are formed between the two contacts 72 and 73 by a p-diamond nanogrit 74 selectively disposed onto the substrate 71 and to which sub-micron particles 75 of $n^+$-Si and sub-micron particles of metal have been added singly or together. The $n^+$-Si may be substituted with other suitably n- or $n^+$-doped semiconductors such as germanium, diamond, silicon carbide, boron nitride or aluminium nitride. The particle sizes of the materials forming the emitter structure are all in the range from 500 nm down to 50 nm. When a voltage is applied across the contacts 72 and 73, electrons are emitted from the interface regions where the diamond particles 74 contact the silicon particles 75, so that an array of isolated interfaces is formed between the substrate 71, the diamond nano-particles and n-type semiconducting particles and/or metal particles added onto the glass surface. This distributed particle structure enhances the incidence of substrate-assisted tunnelling/hopping of electrons through the region containing the p-diamond particles. This conduction mechanism occurs under the influence of the forward voltage bias in the range of 5 to 15 V applied across the junction.

The emitter structure of FIGS. 6 and 7 may be made by conventional printing processes although it is preferably made by inkjet printing. Each particle type is suspended in an aqueous solution containing surfactants formulated to exhibit a viscosity in the region of 2.3 to 3 cps. This enables the materials to be deposited with a carefully controlled particle distribution, with high precision, and in a reproducible manner in order to fabricate an array of emitter sites with similar electrical characteristics. This printing technique also has advantages over conventional printing methods for the production of electron emitter arrays.

Figure 8:
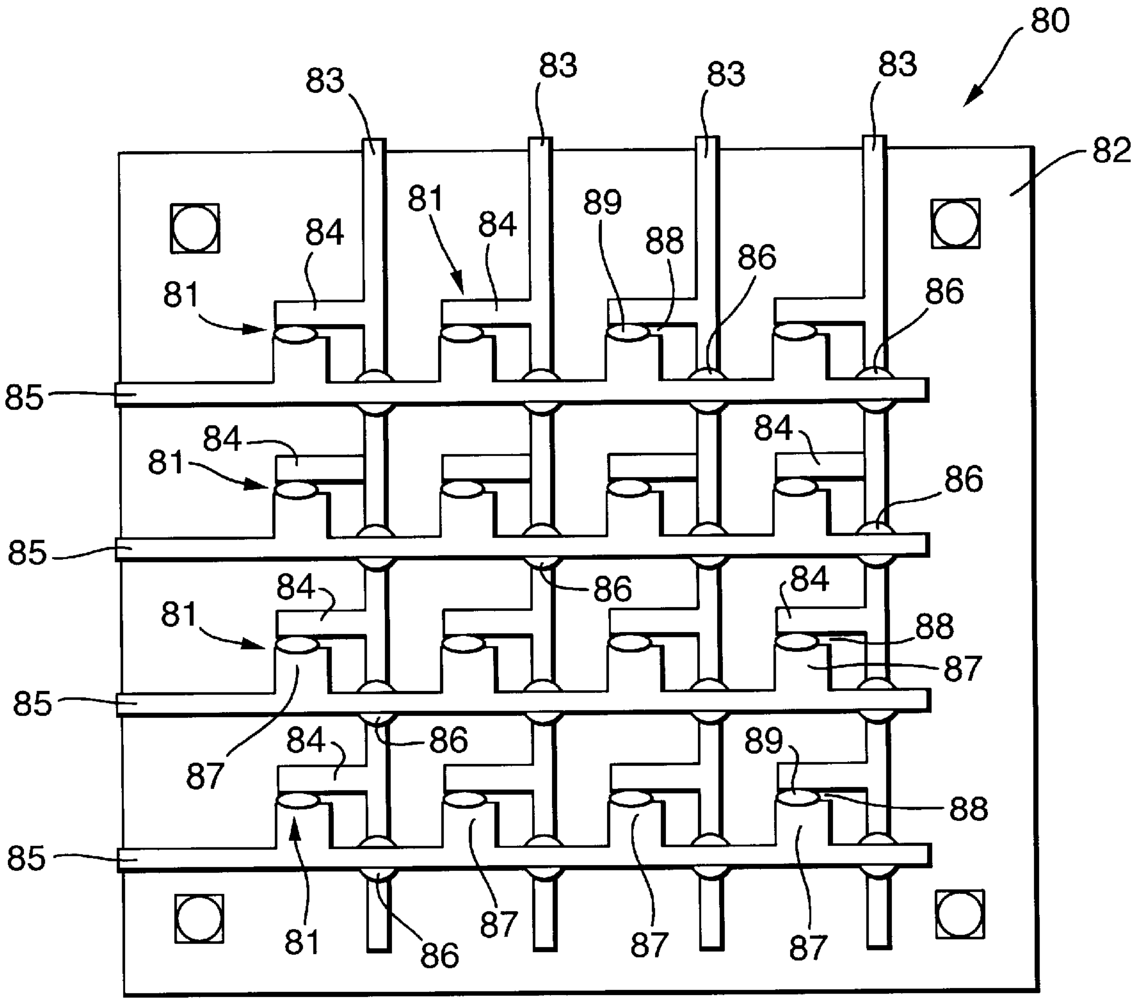
FIG. 8 is a plan view of an array of emitter devices.

Any of the electron emitters described above can be incorporated into an addressable array so that individual emitters can be selectively energized. Such an array could be used to provide a display. An example of one such array 80 employing emitters 81 of the kind shown in FIGS. 6 and 7 is shown in FIG. 8. This has an insulating substrate 82, such as of glass or ceramic, on which are deposited four vertical y-address lines 83 of a metal. Each y-address line 83 has four, short, horizontally-extending contacts 84. Four horizontal x-address lines 85 extend laterally across the substrate 82, being insulated from the y-address lines 83 by insulating pads 86 deposited on the y-address lines. Each x-address line 85 has four vertically-extending contacts 87, which are spaced from the y-address contacts 84 by a small gap 88. Deposited on the substrate 82 within each gap 88 is a small area of the p-type diamond nanogrit and the n-type silicon particles mixed with metal particles so as to form sixteen individual, selectively-addressable emitter regions 89.

The metal address lines 83 and 85 may be of a metal such as Cr, Co, Al, Cu, Au, Ni or ITO and they may be patterned using conventional printing processes such as screen printing or sputter deposition through a lithographically formed mask. Alternatively, the address lines 83 and 85 and insulating pads 86 may be patterned by inkjet printer using printing solutions formulated from commercially available metal-polymer solutions. The desired electrical properties of the array are obtained by suitable heat treatment in flowing air.

The diamond nanogrit is preferably deposited first and then the silicon particles, such as by inkjet techniques. The deposited particles are then treated in hydrogen plasma treatment at an elevated temperature in the range 500° C. to 1000° C., preferably using a positive voltage bias of up to 300 V applied to the y-address lines 83, while keeping the x-address lines 85 electrically floating. The substrate is then annealed by placing the array in a helium or high vacuum ambient using a thermal treatment or selective excimer laser irradiation.

Figure 9:
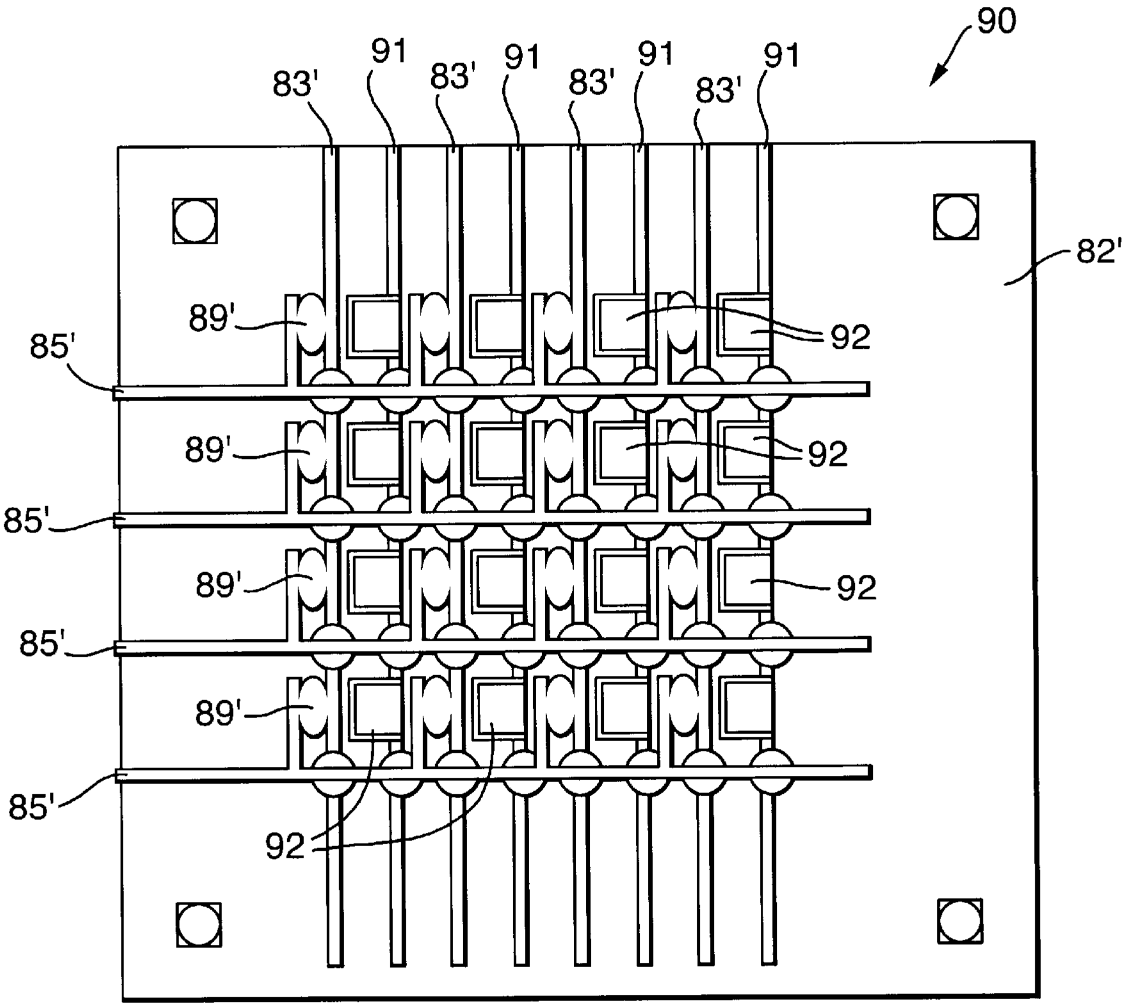
FIG. 9 is a plan view of matrix array monochrome display.

FIG. 9 shows an array 90 of emitters similar to that of FIG. 8, similar components to those in FIG. 8 being given the same number with the addition of a prime'. The array 90 has three y-address lines 83' and three orthogonal x-address lines 85' forming sixteen emitter regions 89' each approximately 100 $\mu$m square. The array 90 also has four anode address lines 91 extending parallel to the y-address lines 83' and each having four phosphor screens or pixels 92 located adjacent a respective emitter region 89'. The phosphor screens 92 are integrated into the glass substrate 82', in contrast with the previous emitter arrangements. The address lines 83', 85' and 91' may be of an optically transparent conductive material, such as ITO, where the phosphor pixels 92 are to be viewed in transmission through the substrate 82', or optically opaque if the pixels are to be viewed in reflection from the direction of the transparent cover glass.

Figure 10:
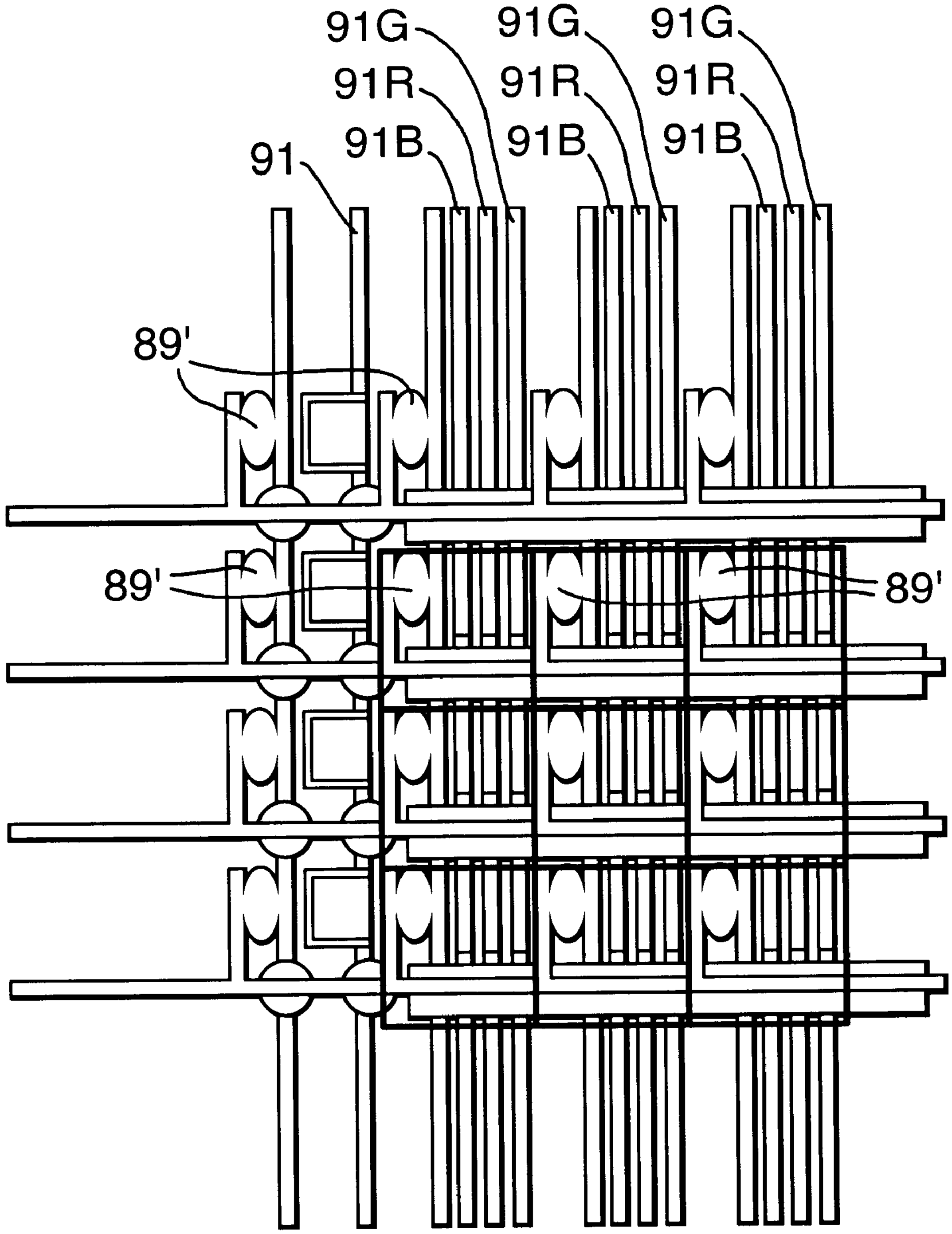
FIG. 10 is a plan view of a matrix array colour display.

FIG. 10 illustrates how the array of FIG. 9 could be modified to form a multi-colour display by the provision of three separate anode address lines 91B, 91R, 91G for each emitter 89', each address line being associated with a pixel phosphor 92B, 92R, 92G of a different colour: Blue, Red or Green. The left-hand column of emitters 89' is depicted in a monochrome configuration for comparison.

What we claim is:

1. An electron emitter comprising:

a region of n-type material;

a region of p-type material; and an interface junction between the two regions, said interface junction being exposed to a vacuum, wherein said interface junction liberates electrons directly from said interface junction into the vacuum, wherein said regions of n-type material and p-type material are formed by a layer of one material on the other material, and wherein said interface junction is exposed at an edge of one of said layers to the vacuum.

2. An emitter according to claim 1, wherein said layer of p-type material is formed on said layer of n-type material, wherein an upper surface of said layer of p-type material is exposed to the vacuum, and wherein said layer of p-type material is thin enough to allow electron transmission through said layer into the vacuum in addition to liberation at the exposed junction.

3. An emitter according to claim 1 including a substrate, wherein said regions of n-type material and p-type material are provided by respective layers on said substrate, and wherein said interface junction is formed along adjacent edges of the two regions.

4. An emitter according to claim 3, wherein the edges of said layers are inclined relative to said substrate.

5. An emitter according to claim 1, wherein the said region of p-type material is less than approximately 1 micron thick.

6. An emitter according to claim 1, including a plurality of said interface junctions exposed to vacuum.

7. An emitter according to claim 6, wherein the plurality of interface junctions are formed by a plurality of particles of one type of material adjacent regions of the other type of material.

8. An emitter according to claim 7, wherein the said particles are of p-type material.

9. An emitter according to claim 7, wherein the said particles are of both p-type material and of n-type material, and wherein said junctions are formed between particles of different types.

10. An emitter according to claim 7, wherein said particles are in the size range of 500 nm to 50 nm.

11. An emitter according to claim 7 including an ohmic contact, wherein said n-type region is a layer on a substrate, and wherein said particles are of p-type and are located on said substrate between an edge of said n-type region and said ohmic contact.

12. An emitter according to claim 1, wherein said p-type material is activated to exhibit negative electron affinity.

13. An emitter according to claim 12, wherein said p-type material is activated by treatment with a hydrogen plasma.

14. An emitter according to claim 12, wherein said p-type material is activated by deposition of a low work function material.

15. An emitter according to claim 1, wherein said p-type material is of diamond.

16. An electron emitter comprising:

a substrate;

a first layer of n-type material on said substrate;

a second layer of p-type diamond on said first layer, said second layer having an upper surface exposed to a vacuum, said second layer forming an edge on an upper surface of said first layer and said second layer being thin enough to be suitable for allowing electron transmission through the layer into the vacuum, wherein said edge includes an interface junction exposed to the vacuum, and wherein electrons are liberated from said edge of the interface junction into the vacuum to supplement any electrons transmitted through the second layer.

17. An electron emitter comprising:

a substrate;

a first layer of n-type material on said substrate;

a second layer of p-type diamond on said substrate;

an interface junction along adjacent edges of said first and second layers exposed to a vacuum, wherein said interface junction is arranged and adapted to liberate electrons directly from the interface junction into the vacuum.

18. An electron emitter comprising:

a substrate;

a continuous first layer of n-type material formed on the substrate; and a discontinuous second layer of p-type diamond particles formed on said substrate intermediate an edge of said first layer and an electrode, said discontinuous second layer being exposed to a vacuum, wherein electrons are liberated into the vacuum from the discontinuous second layer.

19. An electron emitter comprising:

first and second electrodes;

a region of p-type diamond particles and n-type particles each adjacently arranged with respect to each other on said substrate intermediate said first and second electrodes, said adjacently arranged p-type and n-type particle being exposed to a vacuum, wherein adjacent n-type particles and p-type particles form interfaces through which electrons are liberated into the vacuum.

20. A display comprising:

an evacuated housing;

a transparent window;

a fluorescent region;

an electron emitter including a region of n-type material, a region of p-type material and an interface junction between the two regions exposed to a vacuum within the housing, wherein said regions of n-type material and p-type material are formed by a layer of one material on the other material, wherein said interface junction is exposed to the vacuum at an edge of one of said layers; and an anode adapted and arranged to emit electrons from said interface junction directly into the vacuum to strike the fluorescent region, wherein light is transmitted through said window when the emitted electrons strike the fluorescent region.

* * * * *